US012756155B2

(12) United States Patent
Ueda et al.

(10) Patent No.: US 12,756,155 B2
(45) Date of Patent: Oct. 6, 2026

(54) TUNABLE LIGHT SOURCE AND CONTROL METHOD

(71) Applicant: NTT, Inc., Tokyo (JP)

(72) Inventors: Yuta Ueda, Musashino (JP); Yusuke Saito, Musashino (JP)

(73) Assignee: NTT, Inc., Tokyo (JP)

( * ) Notice: Subject to any disclaimer, the term of this patent is extended or adjusted under 35 U.S.C. 154(b) by 709 days.

(21) Appl. No.: 18/248,594

(22) PCT Filed: Oct. 13, 2020

(86) PCT No.: PCT/JP2020/038674
§ 371 (c)(1),
(2) Date: Apr. 11, 2023

(87) PCT Pub. No.: WO2022/079814
PCT Pub. Date: Apr. 21, 2022

(65) Prior Publication Data
US 2023/0378718 A1 Nov. 23, 2023

(51) Int. Cl.
*H01S 5/026* (2006.01)
*H01S 5/0683* (2006.01)

(52) U.S. Cl.
CPC ............ *H01S 5/0683* (2013.01); *H01S 5/026* (2013.01)

(58) Field of Classification Search
CPC ........................................................ H01S 5/062
See application file for complete search history.

(56) References Cited

U.S. PATENT DOCUMENTS

2020/0166453 A1* 5/2020 Lendl ..................... G01N 21/35
2021/0376569 A1* 12/2021 Tanaka ................ H01S 5/06256
2023/0198227 A1* 6/2023 Lee ....................... H01S 5/0687
372/50.12

FOREIGN PATENT DOCUMENTS

JP 2019082633 A * 5/2019

OTHER PUBLICATIONS

English Translation of Ueda (Year: 2019).*
Hiroyuki Ishii, et al., *High-Ability Wavelength Variable Light Source Technology*, NTT Technology Journal, Nov. 2007, pp. 66.
Yuta Ueda, et al., *Electro-Optically Tunable Laser with Ultra-Low Tuning Power Dissipation and Nanosecond-Order Wavelength Switching for Coherent Networks*, Optica, vol. 7, No. 8, Aug. 2020, pp. 1003-1006.

* cited by examiner

*Primary Examiner* — Minsun O Harvey
(74) *Attorney, Agent, or Firm* — Workman Nydegger

(57) ABSTRACT

In the wavelength variable light source and its control method of the present disclosure, intensity of oscillation light in a plurality of non-operating ports of MMI is utilized in consideration of filter characteristics between an operating port and a non-operating port that does not directly contribute to oscillation operation. By controlling the RTF laser so that the light intensity of the wavelength of the oscillation light in the monitored non-operation port is in a desired relationship, a wavelength variable light source reflecting SMSR characteristics is realized. The SMSR can be effectively controlled only by adding a photodetector to a non-operation port which has not been considered by the RTF laser of the prior art. In the wavelength variable light source, the inspection of the SMSR and the SMSR monitor during actual operation can be realized by a simple mechanism.

4 Claims, 8 Drawing Sheets

TUNABLE LIGHT SOURCE AND CONTROL METHOD

TECHNICAL FIELD

The present invention relates to a wavelength variable light source and a method for controlling the same.

BACKGROUND ART

A wavelength variable light source is widely used as a light source capable of arbitrarily adjusting an oscillation wavelength within a range of a constant wavelength band. A wavelength tunable laser diode (TLD) can be used as a typical wavelength tunable light source using a semiconductor. The TLD is used in a wide application range such as a carrier light source for optical communication and gas sensing due to its compactness. In operating TLD, wavelength stability of oscillation output light is important in various systems. The wavelength stability of the oscillation output light, first of all, means that the TLD continues to output an oscillation wavelength as intended by the user. Secondly, it is important that the side mode suppression ratio (SMSR) is equal to or higher than a predetermined value in addition to the accuracy and stability of the wavelength of the oscillation output light.

The SMSR is one of indexes representing the quality of the laser beam, and is defined as an intensity ratio between the peak (oscillation mode) of the spectral intensity of the laser output and the second peak (sub-mode). For example, in optical communication, generally, a light source with SMSR of 40 dB or more is required in non-modulation. This is because the deterioration of the SMSR can directly become noise light for other adjacent wavelength channels in an optical communication network using wavelength division multiplexing (WDM).

As a method of keeping the oscillation wavelength of the TLD constant, a method of inputting a part of the optical output from the TLD to an appropriate wavelength filter and monitoring the optical output from the wavelength filter is adopted. Specifically, as disclosed in NPL 1, light from the TLD is input to an etalon having an appropriate wavelength cycle (FSR: Free Spectrum Range), and the oscillation wavelength of the TLD is controlled so that the light output from the etalon is always constant.

CITATION LIST

Non Patent Literature

[NPL 1] Hiroyuki Ishii, et al., "High-ability wavelength variable light source technology", NTT technology journal, November 2007, pp. 66

[NPL 2] Yuta Ueda, et al., "Electro-optically tunable laser with ultra-low tuning power dissipation and nanosecond-order wavelength switching for coherent networks", Vol. 7, No. 8/August 2020/Optica

SUMMARY OF INVENTION

Technical Problem

However, the inspection of SMSR and the monitoring during actual operation cannot be realized by a simple mechanism in a wavelength variable light source. The oscillation wavelength control mechanism disclosed in NPL 1 is also called a wavelength locker, and the wavelength can be controlled with high accuracy by using an etalon having a narrow-band transmission characteristic. Although the method using the wavelength locker is useful for keeping the wavelength of the laser beam constant, it is difficult to know the state of the SMSR. This is because the optical output from the etalon reflects the wavelength of the oscillation mode of the TLD, and it is difficult to extract wavelength information for the output of the sub-mode having the intensity of about 40 dB lower than that of the oscillation light.

In order to directly know the SMSR of the oscillation output light of the TLD, an optical spectrum analyzer can be used. However, the optical spectrum analyzer requires a mechanism for sweeping the diffraction wavelength of the diffraction grating, and it is further provided with an additional sweeping mechanism in addition to the TLD as the original wavelength sweeping light source. It is not realistic to implement the optical spectrum analyzer measurement on the TLD as an inspection of the TLD performance or for monitoring the TLD in actual operation from the viewpoint of device size and cost. Therefore, there are required a mechanism capable of taking out an output having a high SMSR by reflecting SMSR characteristics in the oscillation output light of the wavelength variable light source, and a method of controlling the oscillation output light.

The present invention has been made in view of the above-mentioned problems, and provides a mechanism of a wavelength variable light source capable of obtaining oscillation output light reflecting SMSR, and a method of controlling the same.

Solution to Problem

One embodiment of the present invention is a method for controlling oscillation light in a wavelength variable light source including: a multi-mode interference waveguide (MMI waveguide) having an M×N port configuration (M is an integer of 1 or more, N is an integer of 2 or more); N reflection type delay lines connected to the N port side of the MMI waveguide respectively; an optical gain waveguide connected to at least one port on an M port side of the MMI waveguide; the method comprising: detecting an intensity of light from the M port side of the MMI waveguide, excluding the at least one port, at the oscillation wavelength of the oscillation light; and generating a signal for controlling the oscillation light based on the basis of the detected intensity.

Another embodiment of the present invention is to provide a wavelength variable light source including:

a multi-mode interference waveguide (MMI waveguide) having an M×N port configuration (M is an integer of 1 or more, N is an integer of 2 or more);

N reflection type delay lines connected to the N port side of the MMI waveguide respectively;

an optical gain waveguide connected to at least one port on the M port side of the MMI waveguide;

a photodetector for detecting an intensity of light from the M port side of the MMI waveguide excluding the at least one port in the oscillation wavelength of the oscillation light;

and a controller being configured to generate a signal for controlling the oscillation light on the basis of the intensity detected by the photodetector.

Advantageous Effects of Invention

The present invention provides a mechanism of a wavelength variable light source that obtains oscillation output light reflecting SMSR, and a method of controlling the same.

DESCRIPTION OF EMBODIMENTS

In the wavelength variable light source and its control method of the present disclosure, the SMSR control is realized by a simple configuration in which a plurality of photodetectors are provided only by paying attention to filter characteristics originally possessed by the RTF laser in the RTF laser using the reflection type transversal filter (RTF). An RTF laser is a form of a wavelength variable light source which has been attracting attention in recent years, and includes an RTF having a multi-mode interference (MMI) interference waveguide and a plurality of reflection type delay lines. In the following description, the MMI waveguide is simply referred to as “MMI” for the sake of simplicity.

The inventors have focused on that wavelength selective filter characteristics represented by reflection characteristics and transmission characteristics between ports in MMI of an RTF laser can reflect intensity differences between oscillation wavelengths and sub-mode wavelengths. As will be described later, in the RTF laser using MMI, there is always a port to which an optical gain medium contributing to the oscillation operation is not connected. Intensity of oscillation light in a plurality of non-operation ports of the MMI is monitored in consideration of filter characteristics between an operation port to which an optical gain medium contributing to the oscillation operation is connected and a non-operation port not directly contributing to the oscillation operation. By controlling the RTF laser so that the intensity of the monitored oscillation light has a predetermined relationship, the control of the wavelength variable light source reflecting the SMSR characteristics is realized.

In the following description, the basic structure of the RTF laser will be described first, and the basic structure and some embodiments of the control mechanism of the wavelength variable light source will be described while paying attention to the wavelength selective filter characteristics observed at the non-operating port of the MMI of the RTF laser. First, a mechanism for controlling the SMSR by monitoring the signal “information” reflecting the SMSR in the RTF laser and feeding back the signal (information) to various wavelength control mechanisms of the RTF laser will be described.

Structure of RTF Laser

Figure 1:
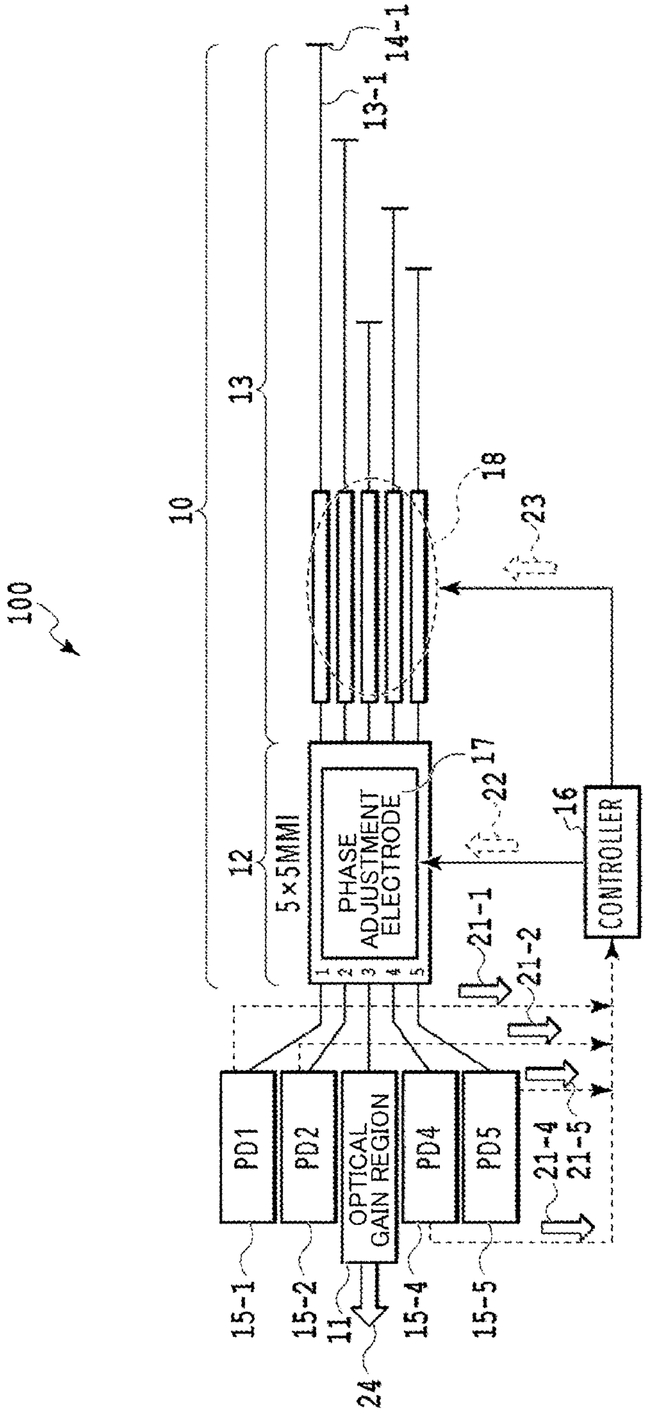
FIG. 1 is a schematic diagram showing a configuration of an RTF laser using a 5×5 port MMI.

FIG. 1 is a schematic diagram showing the structure of an RTF laser using 5×5 ports MMI. The RTF laser 100 is provided with N reflection type delay lines 13 connected to N ports on one side of the M×N port MMI 12 and an optical gain region (optical gain waveguide) 11 connected to at least one port out of the other M ports of the MMI 12. The MMI 12 and the plurality of reflection type delay lines 13 constitute a reflection type transversal filter (RTF) 10. Each of the plurality of reflection type delay lines has a delay line 13-1 which is an optical waveguide different in length and a mirror 14-1 at an end part, and reciprocating optical paths of different optical path lengths are formed between each port on the optical gain region 11 side of the MMI and the mirror at the end part.

In FIG. 1, an optical gain region 11 is connected to the port 3 of the MMI 12, and oscillation light 24 is output from the end of the optical gain region 11. The optical gain region 11 may be an optical gain waveguide including an optical gain region. Here, although no detailed description is made on the oscillation mechanism of the RTF laser 100, laser oscillation occurs at a wavelength in which reflected light from each of a plurality of RTF having different lengths is strengthened at the port 3 of the MMI 12. The oscillation wavelength is adjusted by a phase adjustment electrode 17 on the MMI 12 and a wavelength adjustment electrode 18 on the plurality of reflection type delay lines 13. For details, for example, refer to NPL 2.

In an RTF laser 100 of the present disclosure, in order to monitor and control SMSR, on the optical gain region 11 side of the MMI, photodetectors (PD1, PD2, PD4, PD5) 15-1 to 15-2, 15-4 to 15-5 are provided on (non-used) ports which does not contribute for oscillation operation. In an RTF laser as a wavelength variable light source of the prior art, the wavelength and intensity of the oscillation light itself from the optical gain region 11 are monitored to secure the wavelength stability. The inventors have obtained an idea of utilizing the light intensity information of the wavelength of the oscillation light from the non-operating port, which has not contributed to the oscillation operation in the MMI, for the control of the SMSR. The light intensity signal 21-1 to 21-5 from 1 photodetectors are supplied to a control unit (the following, controller) 16. The controller 16 supplies control signals 22 and 23 to the phase adjustment electrode 17 and the wavelength adjustment electrode 18, respectively, as will be described later, and controls SMSR in accordance with a control method of the present disclosure, which will be described later.

In the RTF laser 100 shown in FIG. 1, the MMI 12 has 5×5 ports, but is not limited to this configuration, and the number M of ports on the optical gain region side is an integer of 1 or more and the number N of ports on the RTF side is an integer of 2 or more, generally, the configuration of M×N ports can be adopted. Although the optical gain region 11 for generating and amplifying light is connected to the port 3 in FIG. 1, it may be connected to other ports. The optical gain region 11 may be provided in a plurality of ports on the M port side as described in NPL 2. Further, since the optical gain region can also be used as the light absorbing layer in general, for example, the optical gain regions which are provided on all the M ports and do not contribute to the oscillation operation may be used as the photodetector. In addition, one or more ends (mirrors) among a plurality of reflection type delay lines of the RTF laser 100 may output oscillation light.

The photodetectors (PD1 to PD5) connected to the non-operating port in FIG. 1 may be monolithically integrated on the same substrate as the substrate constituting the RTF laser 100, or may be provided outside the substrate and receive light from the MMI port of the RTF laser. Next, the control operation in the method of controlling the wavelength variable light source of the present disclosure will be described with reference to the characteristics of the wavelength selective filter in the RTF laser 100.

Control of SMSR in an RTF laser

Figure 2:
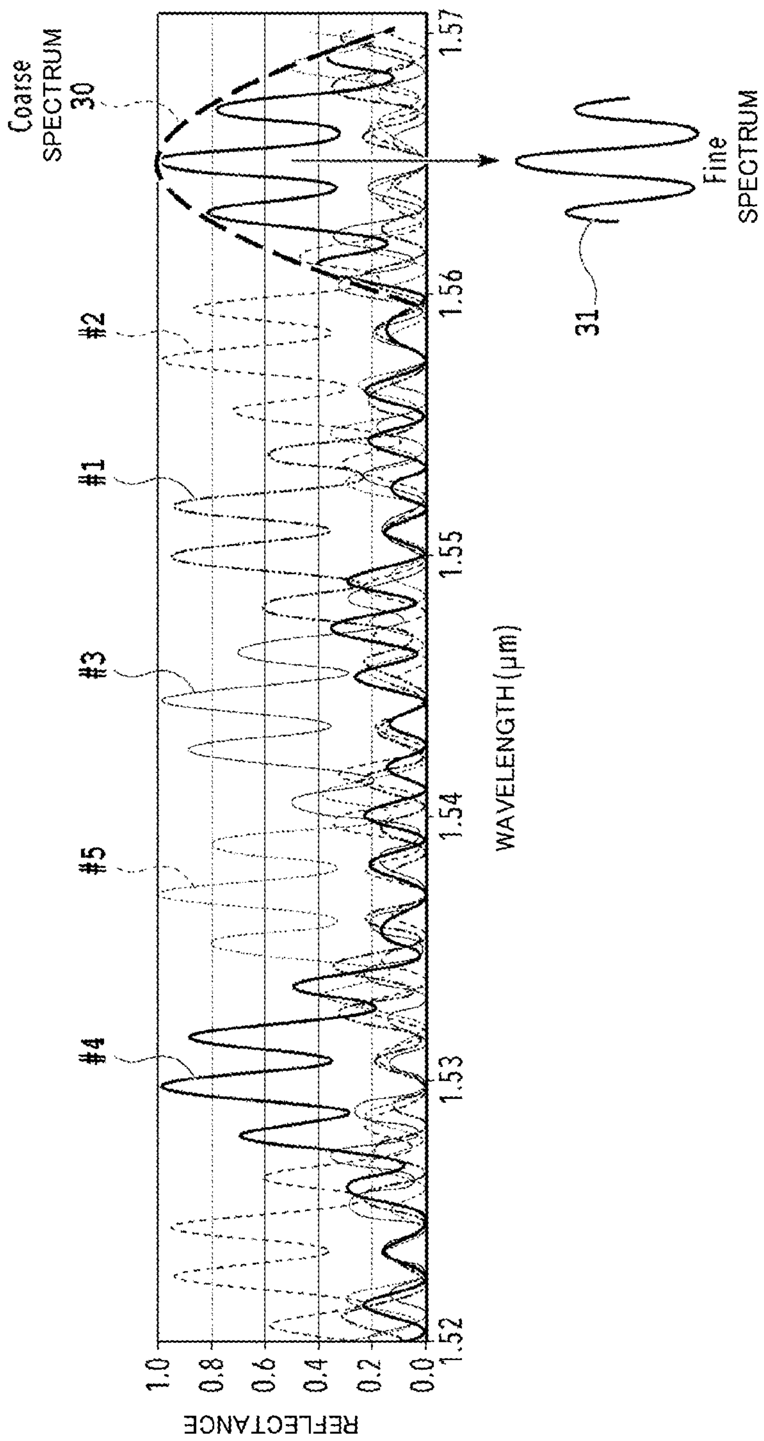
FIG. 2 is a diagram showing wavelength selective filter characteristics in an RTF laser of the present disclosure.

FIG. 2 is a diagram showing wavelength selective filter characteristics in the RTF laser of the present disclosure. In the RTF laser having the configuration shown in FIG. 1, a number of waveforms in FIG. 2 are reflection spectra of port 1 to 5 (M side) observed at port 3 (the following, operating port) which is connected to an optical gain region 11 and operating for an oscillation operation. The horizontal axis represents the wavelength (μm), the vertical axis represents the reflectance, and corresponding ports 1 to 5 are indicated by #1 to #5.

It should be noted here that the "reflectance" in the following description represents the reflection spectrum for the entire RTF 10 consisting of the MM 112 and the plurality of reflection type delay lines 13 as viewed from the operating port 3. The operating port 3 is indicated by a label of #3, and represents the reflectance of the operating port 3 in the form of a letter. The reflectance of the operating port 3 is the same as reflectance of light at a specific port generally used in an optical circuit, and the reflection loss is also obtained from the value of the reflectance. In a state where laser oscillation is generated, ideally, the reflectance of the operating port 3 is 1.

On the other hand, the waveform curves indicated by the labels of #1, #2, #4, and #5 in FIG. 2 are reflectance values at the non-operation ports 1, 2, 4, 5 respectively, when viewing the entire RTF 10. It should be noted that the "transmission characteristics" between different ports is substantially represented by reflecting all the optical paths of the RTF 10 consisting of forward and backward paths formed by being folded back by the mirror at the end of each delay line. For example, the reflection spectrum curve indicated by the label of #1 in FIG. 2 shows the transmission characteristic from the port 3 to the port 1. In FIG. 2, the reflection spectra #1 to #5 which are located at different positions on the wavelength axis and show waveforms having a substantially similar shape, can be confirmed. These reflection spectra indicate that interference states by N reflection type delay lines of different lengths in the RTF10 of FIG. 1 are observed as different filter characteristics according to M ports of the MMI. It should be noted that the reflection characteristics observed at each port of the MMI of FIG. 2 show the "wavelength selective filter characteristics" of the entire RTF10 to cause laser oscillation at a particular wavelength. In the following description, reflection characteristics or transmission characteristics observed at each port on the side of the optical gain region 11 of the MMI are referred to as reflectance or reflection spectrum for the sake of simplicity.

Further, in FIG. 2, in detail, the reflection spectra #1 to #5 observed at each port of the MMI consists of a component of a short cycle with an FSR of 2 nm or less and a component of a long cycle which is an envelope thereof. Here, the spectrum of the component of the short cycle is called a fine spectrum 31, and the component of the long cycle indicated by the dotted line is called a coarse spectrum 30. The fine spectrum 31 and the coarse spectrum 30 can be independently adjusted by applying appropriate electric signals to the wavelength adjustment electron group 18 on the N reflection type delay lines (NPL 2). For example, the position of the fine spectrum 31 on the wavelength axis can be controlled while the position of the coarse spectrum 30 on the wavelength axis is kept at the same position. At this time, the fine spectrum 31 is controlled so as to shift its peak position while inscribed in the dotted line showing the coarse spectrum 30.

Figure 3:
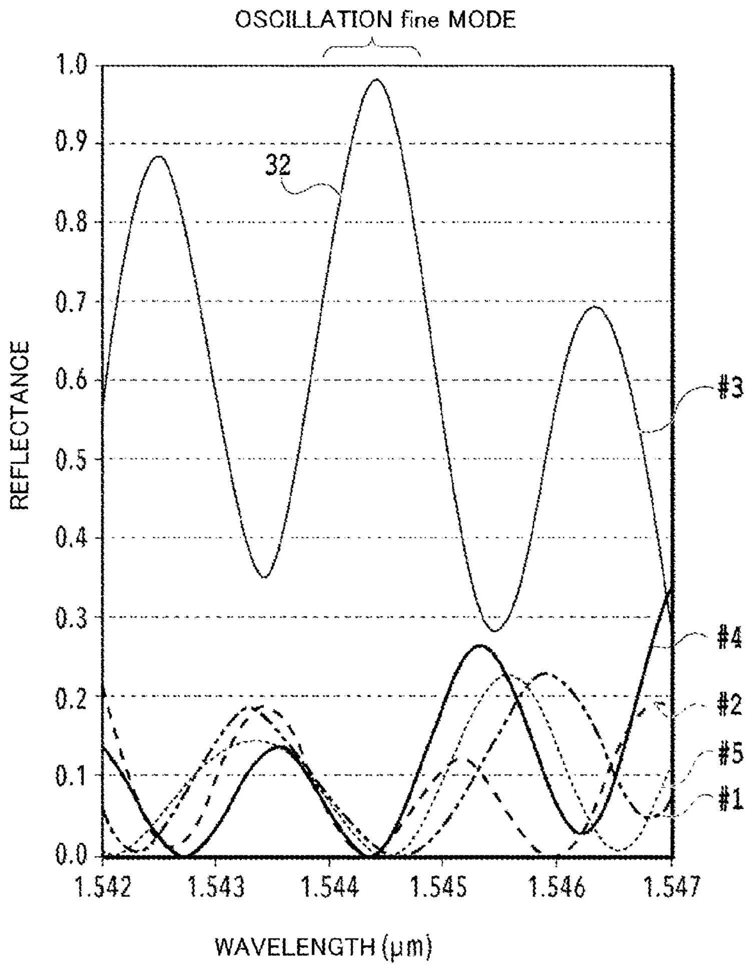
FIG. 3 shows an enlarged diagram of reflectance in the wavelength 1.544 μm vicinity.

FIG. 3 shows an enlarged diagram of reflectance in the wavelength 1.544 μm vicinity. In FIG. 2, at a vicinity of 1.544 μm on the horizontal axis, the reflectance of the operating port 3 indicated by the label of #3 represents a reflection spectrum of a wavelength region having a peak. In the RTF laser shown in FIG. 1, since the optical gain region 11 is connected to the port 3, laser oscillation is realized in the vicinity of the peak wavelength of the fine spectrum #3 shown in FIG. 3. Hereinafter, the oscillation occurring in the vicinity of the peak in the fine spectrum contributing to the laser oscillation is called an oscillation fine mode.

The more exact laser oscillation wavelength in the oscillation fine mode is a wavelength satisfying the resonator longitudinal mode condition. The resonator longitudinal mode condition is a condition that light reciprocating through a resonator formed by the RTF 10 forms a standing wave in the resonator. When the refractive index as the resonator of the RTF laser 100 shown in FIG. 1 is represented by n and the length is represented by L, the wavelength λ, satisfying the following equation is the wavelength λ, (m is a natural number) that satisfies the longitudinal oscillation mode condition.

$$m\lambda=2nL \quad \text{equation (1)}$$

mode condition of the above equation is determined by the number, length, and structure of the delay lines in the optical waveguide of the RTF 10, the structure of the MMI waveguide, and the refractive index of the material of each part, and can be adjusted by the phase adjustment electrode 17.

Figure 4:
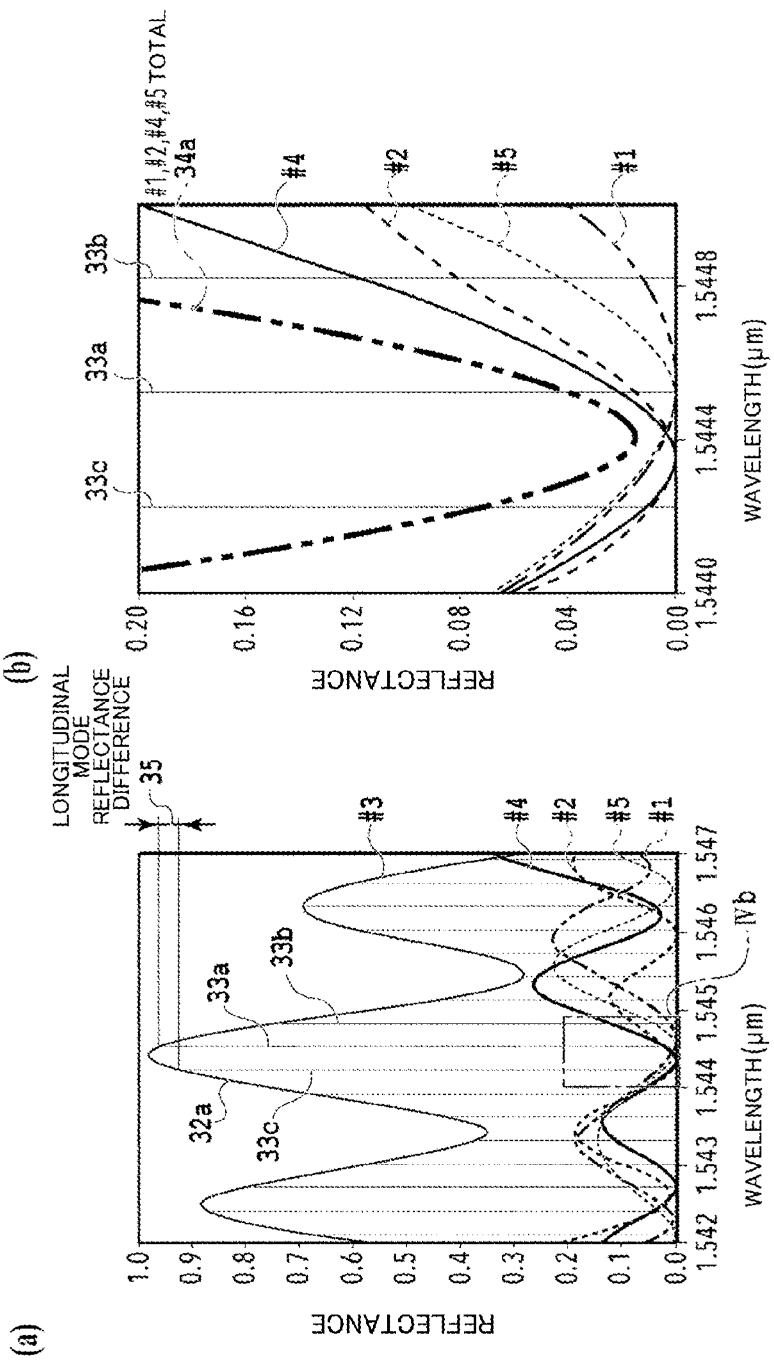
FIG. 4 shows the relationship between the reflection spectrum of the RTF laser and the longitudinal mode condition.

FIG. 4 is a diagram showing the relationship between the reflection spectrum and the longitudinal mode condition in the RTF laser. FIG. 4(*a*) is a diagram of an enlarged diagram of reflectance in the wavelength 1.544 μm vicinity showed in FIG. 3 overwritten with longitudinal mode cycle of FSR=0.3 nm. Therefore, the reflection spectra shown in FIG. 4(*a*) is the same as the reflection spectra shown in FIG. 3. FIG. 4(*b*) is a further enlarged diagram showing the reflectance of the non-operating ports 1, 2, 4 and 5 whose reflectance is near 0 in the wavelength region near the oscillation fine mode of the reflection spectra of FIG. 4(*a*).

In FIG. 4(*a*), the wavelength of the line at equal intervals satisfies the longitudinal mode condition is shown with respect to the reflection spectrum 32*a* of the operating port 3 of the MMI. In the vicinity of the peak wavelength of the fine spectrum 32*a* of the operating port 3, the oscillation vertical mode line 33*a* closest to the peak of the oscillation fine mode among the oscillation vertical mode lines 33*a*, 33*b*, 33*c* becomes the oscillation wavelength of the RTF laser 100 shown in FIG. 1. In FIG. 4(*a*), the vertical oscillation mode line 33*c* on the wavelength side shorter than the vertical oscillation mode line 33*a* shows the next higher reflectance.

In FIG. 4(*b*), the reflection spectra #1, #2, #4, and #5 at the non-operating port are shown in an enlarged manner, and the total reflection spectrum 34*a* obtained by adding the reflectance of the four non-operating ports is also shown. Here, the reflection spectra at the four non-operating ports of FIG. 4(*b*) have different values of the oscillation wavelength at the wavelength of the vertical mode line 33*a*. In the oscillation state satisfying the vertical mode condition, the light of the oscillation wavelength is observed at the four non-operating ports at intensities corresponding to the reflectance of FIG. 4(*b*), respectively.

In the wavelength locker in NPL 1 disclosed as an example of the prior art, the fine adjustment of the oscillation wavelength is realized mainly by controlling the longitudinal mode wavelength. In the RTF laser 100 shown in FIG. 1, an appropriate electric signal is applied to the phase adjustment electrode 17 to finely adjust the refractive index n in equation (1), thereby realizing fine adjustment of the oscillation wavelength. At this time, fine adjustment of the electric signal to the phase adjustment electrode 17 corresponds to adjustment of the oscillation longitudinal mode lines 33*a*, 33*b*, 33*c* with respect to the reflection spectra of the operating port 3 on the wavelength axis of FIG. 2.

Here, considering the SMSR in the RTF laser 100, in a state where the laser oscillates at the wavelength of the oscillation vertical mode line 33*a* in the vertical mode condition in FIG. 4(*b*), the difference 35 of the vertical mode reflectance in the two oscillation vertical mode lines 33*a* and 33*c* determines the SMSR. In the oscillation state, most of the energy supplied to the optical gain region is consumed at the oscillation wavelength of the longitudinal mode wavelength, but the oscillation state is observed even at the wavelength of an oscillation longitudinal mode line 33*c* having a higher reflectance next to the oscillation longitudinal mode line 33*a*. Therefore, when the peak wavelength of the reflectance 32*a* of the operating port 3 of FIG. 4(*a*) coincides with the oscillation longitudinal mode line 33*a*, a longitudinal mode reflectance difference 35 which is an intensity difference from an adjacent longitudinal mode becomes maximum, and SMSR becomes maximum.

As described above, even if the position of the oscillation longitudinal mode line is adjusted in the RTF laser 100, the peak of the reflection spectrum 32*a* and the oscillation longitudinal mode line 33*a* may not completely coincide with each other only by relatively adjusting the position of the envelope of the fine spectrum together with the coarse spectrum 30. The RTF laser of the prior art is considered to correspond to a state in which the peak of the fine spectrum 32*a* and the oscillation longitudinal mode line 33*a* do not completely coincide with each other as shown in FIG. 4(*a*).

The inventors have considered that it is necessary not only to adjust the longitudinal mode oscillation wavelength on the wavelength axis by adjusting the relative position between the oscillation longitudinal mode line and the coarse spectrum, but also to adjust the fine spectrum to maximize the SMSR.

As is apparent from the relation between the reflection spectrum #3 of the operating port 3 of FIG. 4(*a*), FIG. 4(*b*), and the reflection spectra #1, #2, #4, #5, it can be seen that the wavelength of the peak of the fine spectrum 32*a* and the wavelength of the minimum value of the total reflection spectrum 34*a*, which is the sum of the reflectance of the four non-operating ports, are generally coincident. Therefore, in the MMI 11 of the RTF laser 100, the value of the SMSR can be maximized by adjusting the reflection spectra #1, #2, #4, and #5 shown in FIG. 4(*b*), while monitoring the intensity of the light of the wavelength of the oscillation light observed at the non-operating port.

Figure 5:
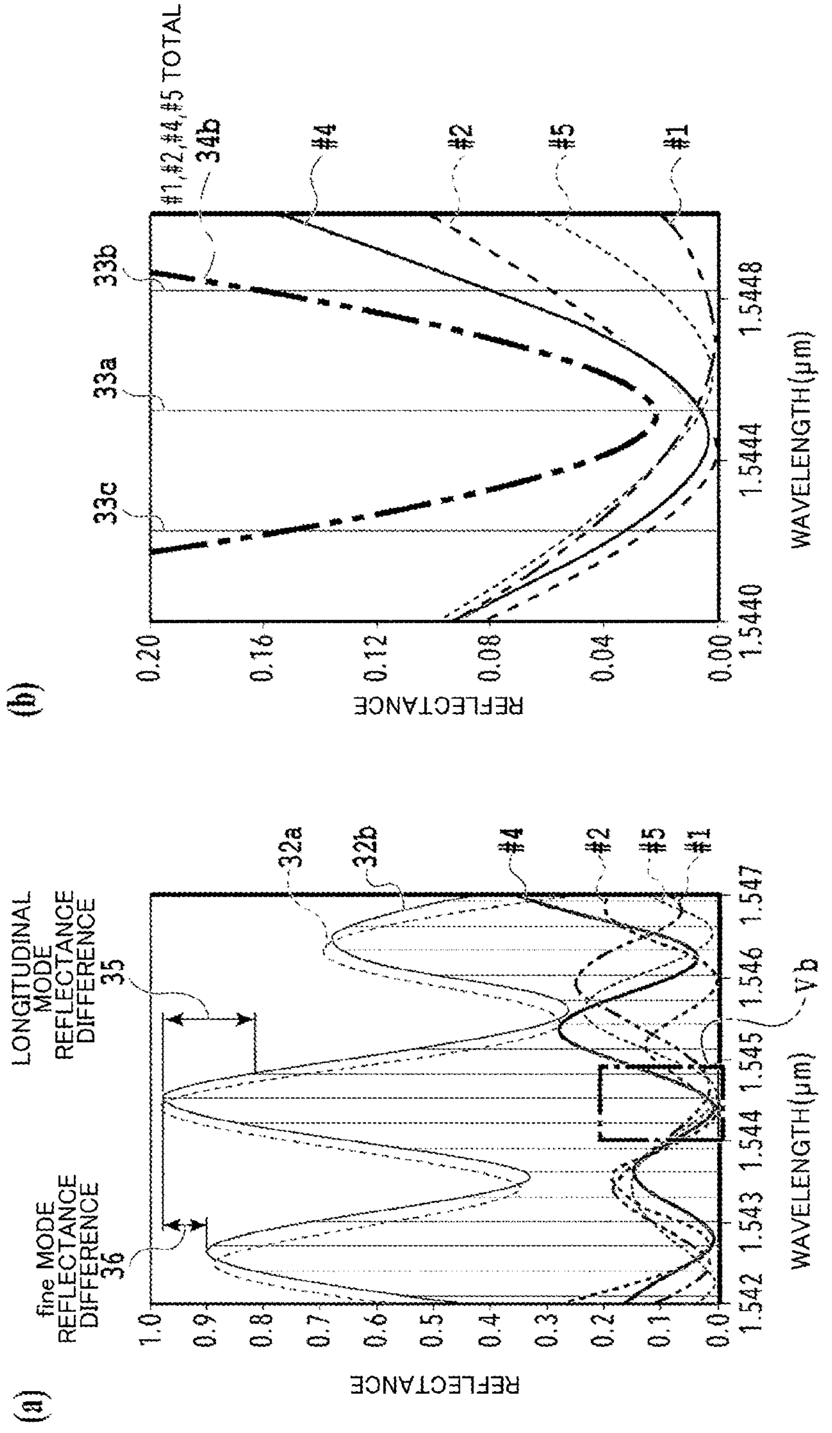
FIG. 5 is a diagram for explaining SMSR adjustment by the intensity of oscillation light of a non-operating port.

FIG. 5 is a diagram for explaining SMSR adjustment based on the intensity of the oscillation light of the non-operating port in the method of controlling the wavelength variable light source of the present disclosure. FIG. 5(*a*) shows a reflection spectrum obtained by further adjusting the fine spectrum after the adjustment of the vertical mode oscillation wavelength. In FIG. 5(*b*) is a further enlarged diagram showing the reflectance of the non-operating ports 1, 2, 4 and 5 in the wavelength range near the oscillating fine mode of the reflection spectra in FIG. 5(*a*), where the reflectance is near zero.

In FIG. 5(*a*), the dotted line 32*a* shows only the reflection spectrum of the operating port 3 before the adjustment of the fine spectrum, and the dotted line 32*a* is the same as the reflection spectrum 32*a* in FIG. 4(*a*). The solid line shows a state in which the peak of the oscillation fine mode and the oscillation vertical mode line 33*a* completely coincide with each other by slightly shifting the fine spectrum to the longer wavelength side. In this case, the difference 35 of the longitudinal mode reflectance is larger than that of the case in FIG. 4(*a*) by three times or more, and it is expected that the SMSR is improved.

In FIG. 5(*b*), the reflection spectra #1, #2, #4, and #5 of the non-operating ports are shown, and the total reflection spectrum 34*b*, which is the sum of the reflectance at the four non-operating ports, is also shown. Here, the wavelength giving the minimum point of the total reflection spectrum 34*b* coincides with the oscillation longitudinal mode line 33*a*. Therefore, the wavelength variable light source may be controlled so that the total amount of signal intensity detected by the photodetectors 15-1 to 15-5, of the non-operating ports #1, #2, #4, and #5, becomes minimum in a predetermined laser oscillation wavelength (the oscillation vertical mode line 33*a*).

Therefore, a method of controlling oscillation light in a wavelength variable light source of the present disclosure includes a step of detecting intensity 21-1 to 21-5 of light from the M port side of each MMI waveguide, excluding at least one port. Further, the method includes a step in which the controller 16 generates signals 22, 23 for controlling the oscillation light 24 on the basis of the detected intensity. The control signals 22 and 23 operate to control the positions of the fine spectrum and the coarse spectrum on the wavelength axis with respect to the wavelength adjustment electrode 18.

As described above, the adjustment of the reflection spectrum on the wavelength axis is realized by the wavelength adjustment electrode 18. The wavelength adjustment electrode 18 is a plurality of electrodes formed on the plurality of reflection type delay lines 13. A specific method of applying any voltage to the wavelength adjustment electrode 18 to change the reflection spectrum is not limited in the present invention. That is, the method of controlling the oscillation light in the wavelength variable light source of the RTF laser is characterized by the step of detecting the intensity of the light from the M port side of the MMI waveguide, excluding at least one port to which the optical gain waveguide is connected, and generating signals to control the oscillation light based on the detected intensity. The wavelength adjustment electrode 18 may be controlled so that the total reflection spectrum 34*b* obtained by adding the reflection spectra #1, #2, #4, and #5 at the non-operation port becomes minimized.

Therefore, the present invention may realize a method of controlling a multi-mode interference waveguide (MMI waveguide) having an M×N port configuration (M is an integer of 1 or more, N is an integer of 2 or more), N reflection type delay lines connected to the N port side of the MMI waveguide, and an oscillation light in a wavelength variable light source including an optical gain waveguide connected to at least one port on an M port side of the MMI waveguide; the method comprising: detecting the intensity of an light from the M port side of the MMI waveguide, excluding at least one port in an oscillation wavelength of the oscillation light; and generating a signal for controlling the oscillation light based on the detected intensity.

Referring again to FIG. 1, light intensity signal 21-1 to 21-5 are supplied from the photodetector 15-1 to 15-5 to the controller 16, and the controller 16 generates a control signal 23 to the wavelength adjustment electrode 18 based on the received light intensity signal 21-1 to 21-5. Each light intensity signal is an electric signal corresponding to the reflectance of the reflection spectra #1, #2, #4, and #5, and the total reflection spectrum 34*b* is a sum of these four electric signals. FIG. 1 shows only that the light intensity signal 21-1 to 21-5 are supplied to the controller 16, and there is no limitation on how the total signal corresponding to the total reflection spectrum 34*b* is acquired. The four electric signals may be physically summed up, or after each electric signal is converted into a digital signal, the total signal may be obtained by performing arithmetic processing.

Therefore, the present invention may realize a wavelength variable light source comprising: a multi-mode interference waveguide (MMI waveguide 12) having an M×N port configuration (M is an integer of 1 or more, N is an integer of 2 or more); N reflection type delay lines 13 connected to the N port side of the MMI waveguide, respectively; an optical waveguide 11 connected to at least one port on the M port side of the MMI waveguide; photodetectors 15-1 to 15-5 for detecting an intensity of light from the M port side of the MMI waveguide excluding at least one port in the oscillation wavelength of the oscillation light; and a controller 16 being configured to generate a signal for controlling the oscillation light on the basis of the intensity detected by the photodetector.

As described above, according to the wavelength variable light source or the RTF laser of the present disclosure, and the method of controlling the same, the intensity at the oscillation wavelength from the non-operating port which does not contribute to the oscillation operation, excluding at least one port to which the optical gain region of the RTF laser is connected is detected at photodetectors, and monitored. The wavelength variable light source of the present disclosure is characterized by a mechanism for generating a signal for controlling oscillation output light in the wavelength variable light source through a controller on the basis of the intensity of light observed at the non-operation port obtained by the photodetector. In a photodetector connected to the non-operation port, light of all wavelengths appearing in the non-operation port is detected. However, as can be seen from the reflection spectra #1, #2, #4, and #5 in FIG. 5(*b*), it should be noted that, in a state where laser oscillation is performed at the port 3 of the MMI 11, the signal intensity of the oscillation wavelength observed at the ports 1, 2, 4, 5 is 0.01 or less and the "leakage light" of the oscillation output light at the port 3 is measured by the photodetector. The RTF laser of the prior art is greatly different from the RTF laser of the present disclosure utilizing the intensity of the oscillation light from the non-operating port in that the oscillation light itself from the operating port to which the optical gain region contributing to the oscillation operation is connected is detected. By controlling the positions of the fine spectrum and the coarse spectrum of the oscillation output light on the wavelength axis by a signal from the controller, the wavelength variable light source is controlled so as to minimize the SMSR.

A more specific control method of the wavelength variable light source and the control method thereof of the present disclosure will be described in the following embodiments.

Embodiment 1

In the wavelength variable light source and the control method thereof of the present disclosure, the total amount of intensity signals measured by the photodetector connected to the non-operating port is minimized to maximize the SMSR in the oscillation output light. The SMSR can be maximized by shifting the fine spectrum in the reflection spectrum of the non-operating port on the wavelength axis and finely adjusting the wavelength selective filter characteristics of the RTF. Here, when controlling the spectrum of the RTF, information for determining the control direction of the spectrum on the wavelength axis is required. For example, when FIG. 4(*a*) is compared with FIG. 5(*b*), the fine spectrum is shifted to the longer wavelength side in order to match the peak wavelength of the oscillation fine mode of the reflection spectrum 32*a* of the port 3 and the longitudinal mode wavelength (oscillation longitudinal mode line 33*a*). Therefore, in the RTF laser of the prior art, information about the direction in which the fine spectrum should be further shifted on the wavelength axis may be obtained after the fine adjustment of the oscillation wavelength is performed by applying an appropriate electric signal to the phase adjustment electrode 17. According to this information, the control procedure by the controller 16 in the RTF laser shown in FIG. 1 is simplified, and the SMSR can be optimized more easily. Therefore, an embodiment of determining the adjustment direction of the reflection spectrum of the RTF on the wavelength axis by focusing on the magnitude relationship of the intensity of the oscillation output light observed at the non-operating port will be described.

Here, attention is paid to the reflection spectra #1, #2, #4 and #5 in FIG. 4(*b*) after the fine adjustment of the oscillation wavelength is performed again. It can be seen that the intensity of light observed on the longer wavelength side and the shorter wavelength side with respect to the peak wavelength of the reflectance 32*a* of operating port 3 (the wavelength of the minimum value of the nearly total reflection spectrum 34*b*), differs depending on the port. In the case of the MMI 12 of 5×5 configuration of the RTF laser in FIG. 1, in the longer wavelength side of the peak of the reflectance 32*a* (for example, the oscillation longitudinal mode line 33*a*) of port 3 like FIG. 4(*b*), the relation of reflectance #2, #4>reflectance #1, #5 is established. On the other hand, in the shorter wavelength side of the peak of the reflectance 32*a* of port 3 (for example, the oscillation longitudinal mode line 33*c*), the relationship of reflectance #2, #4<reflectance #1, #5 is established.

For example, when the RTF laser is actually operated, when the relation of the intensity of the light from the photodetector 15-1 to 15-5 is reflectance #2, #4>reflectance #1, #5, it can be determined that the peak wavelength of the oscillation fine mode 32*a* is located on the shorter wavelength side with respect to the oscillation vertical mode peak wavelength (the oscillation longitudinal mode line 33*a*). On the other hand, in the case of reflectance #2, #4<reflectance #1, #5, it can be judged that the peak wavelength of the oscillation fine mode 32*a* is located on the longer wavelength side with respect to the desired oscillation vertical mode peak wavelength (the oscillation longitudinal mode line 33*a*). By comparing the magnitude relation of the intensity of each light in the photodetector 15-1 to 15-5 with respect to the given vertical mode wavelength (oscillation wavelength), the information of the adjustment direction can be obtained as to whether the fine mode peak wavelength, i.e., the reflectance 32*a* of the port 3 should be shifted to the longer wavelength side or the shorter wavelength side.

The above-described adjustment direction of the reflection spectrum of the RTF on the wavelength axis may be determined by comparing the light intensity signals from the photodetector 15-1 to 15-5 in FIG. 1, based on a previously known magnitude relationship. Therefore, the process of determining the control signal 23 in the controller 16 is changed only with the structure of the RTF laser shown in FIG. 1. The relationship between the ports of the reflection spectra #1, #2, #4, and #5 described above with reference to FIG. 4(*b*) is in the configuration of the MMI 11 of FIG. 1 in which the optical gain region is connected to the port 3, and varies according to the configuration of the MMI and the location of the operating port to which the optical gain region is connected. Therefore, the relationship between the intensity of the light of the oscillation wavelength observed between specific ports among the non-operating ports may be known in advance in accordance with the configuration of the RTF laser including the MMI used. In short, it is sufficient to know the relationship in which the adjustment direction of the reflection spectrum on the wavelength axis can be determined by grasping the wavelength selective filter characteristics shown in FIG. 2. The non-operating ports for comparing the magnitude relation of the intensity of the light in the photodetector are not limited at all, and the number of ports for comparing the intensity is not limited to the relation between the two ports and the other two ports, but may be arbitrary.

Embodiment 2

In the basic control method of SMSR in the RTF laser described with reference to FIGS. 4 and 5, only the reflectance of each port at the wavelength of the oscillation longitudinal mode line 33*a* in the vicinity of the peak of the oscillation fine mode is noticed. However, when the SMSR is optimized, by paying attention to the relative relation between the coarse spectrum and the fine spectrum, an index effective for optimizing the SMSR can be found even in the peak of the adjacent fine spectrum separated from the oscillation longitudinal mode line 33*a*.

Figure 6:
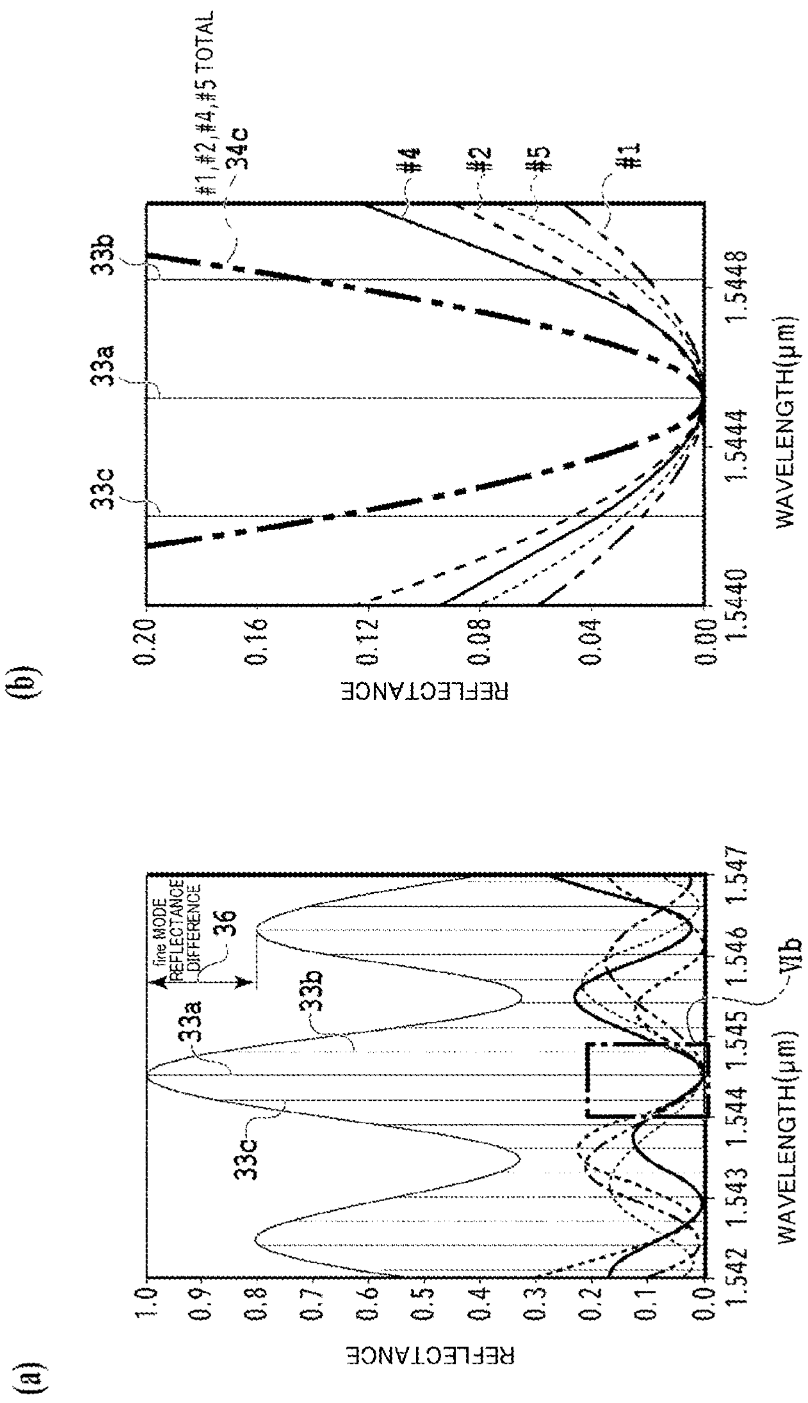
FIG. 6 is a diagram for explaining optimization at peaks of adjacent fine spectra.

FIG. 6 is a diagram for explaining optimization at peaks of adjacent fine spectra. FIGS. 6(*a*) and (*b*) shows the state in which the SMSR of the reflectance of adjacent fine modes are reduced by adjusting the coarse filter, further from the state of FIGS. 5(*a*) and (*b*) in which the peak wavelengths of the oscillation fine modes satisfy the longitudinal mode condition.

As described above, according to the wavelength variable light source or the RTF laser of the present disclosure, and the method of controlling the same, the intensity at the oscillation wavelength from the non-operating port which does not contribute to the oscillation operation, excluding at least one port to which the optical gain region of the RTF laser is connected is detected at photodetectors, and monitored. The wavelength variable light source of the present disclosure is characterized by a mechanism for generating a signal for controlling oscillation output light in the wavelength variable light source through a controller on the basis of the intensity of light observed at the non-operation port obtained by the photodetector. In a photodetector connected to the non-operation port, light of all wavelengths appearing in the non-operation port is detected. However, as can be seen from the reflection spectra #1, #2, #4, and #5 in FIG. 5(*b*), it should be noted that, in a state where laser oscillation is performed at the port 3 of the MMI 11, the signal intensity of the oscillation wavelength observed at the ports 1, 2, 4, 5 is 0.01 or less and the "leakage light" of the oscillation output light at the port 3 is measured by the photodetector. The RTF laser of the prior art is greatly different from the RTF laser of the present disclosure utilizing the intensity of the oscillation light from the non-operating port in that the oscillation light itself from the operating port to which the optical gain region contributing to the oscillation operation is connected is detected. By controlling the positions of the fine spectrum and the coarse spectrum of the oscillation output light on the wavelength axis by a signal from the controller, the wavelength variable light source is controlled so as to maximize the SMSR.

When a comparison is made between FIG. 6(*b*) and FIG. 5(*b*), a total reflection spectrum 34*b* of a non-operating port takes an extreme value in an oscillation longitudinal mode, that is, in the wavelength of an oscillation longitudinal mode line 33*a* in FIG. 5(*b*). However, the individual reflection spectra of the non-operating ports #1, #2, #4, and #5 are not extreme values. On the other hand, in FIG. 6(*b*) in which SMSR is optimized at the peak of the adjacent fine spectrum of this embodiment, the total reflection spectrum 34*c* of the non-operating port, and all of individual reflection spectra #1, #2, #4, and #5 take an extreme value on the oscillation vertical mode line 33*a*. That is, not only minimizing the total reflection spectrum of the non-operating port, but also the wavelength adjustment electrode 18 may be controlled so that the individual reflection spectra of the non-operating port #1, #2, #4, and #5 are minimized. A method for controlling individual reflection spectra #1, #2, #4, and #5 on a wavelength axis independently is known, and what voltage is applied to which electrode of the wavelength adjustment electrode 18 depends on the specification of the wavelength adjustment electrode 18.

The difference between the above-described basic method of controlling SMSR and the present embodiment is that the relative relationship between the coarse spectrum and the fine spectrum is reflected. Referring to FIG. 6(*a*), two peaks on both sides adjacent to a peak matching the oscillation longitudinal mode line 33*a* have the same intensity in the fine spectrum of the operating port 3. At this time, the intensity difference between the peak of the fine spectrum of the operating port 3 and the adjacent peak, that is, the fine mode reflectance difference 36, is the maximum. The difference in fine mode spectrum is apparent from the comparison with the fine mode reflectance difference 36 of FIG. 5(*a*). The state in which the fine mode reflectance difference 36 becomes maximum corresponds to the state in which the individual reflection spectra of the non-operating port #1, #2, #4, and #5 are minimized, as shown by FIG. 6(*b*). As can be understood from the relationship between the fine spectrum 31 and the coarse spectrum 30 described with reference to FIG. 2, it can be seen that the coarse spectrum and the fine spectrum have been adjusted so that the peaks of the coarse spectrum and the fine spectrum coincide with each other in the state where the coarse spectrum a is adjusted in FIG. 6(*a*).

In FIG. 1, the wavelength adjustment electrode 18 can be controlled so as to minimize each of the light intensity signals 21-1 to 21-5, from the photodetector 15-1 to 15-5, respectively. At this time, the coarse spectrum and the fine spectrum are adjusted, and the SMSR deterioration in adjacent fine modes derived from a mode different from the oscillation fine mode (adjacent fine mode) can be reduced.

Also in this embodiment, it is only necessary to change the determination processing of the control signal 23 in the controller 16, while the construction of the RTF laser 100 shown in FIG. 1 is unchanged. That is, in a method for controlling oscillation light in a wavelength variable light source, based on intensities of light from two or more ports that do not contribute to oscillation operation (reflection spectra #1, #2, #4, and #5), a step to minimize each of these intensities may be performed.

Embodiment 3

In a system using a wavelength variable light source, a difference between a wavelength desired by a user and a wavelength of oscillation light actually outputted may be larger than a fixed value, or an SMSR of laser oscillation light may be lower than the fixed value. In such a state, when the wavelength variable light source is viewed on other wavelength channels except the intended wavelength channel, wavelength crosstalk occurs, and interference and disturbance occur. For example, in wavelength division multiplexing (WDM) systems of an optical communication network, in which information is carried in different wavelength channels, degradation of the SMSR of one wavelength tunable light source can directly result in noise light when viewed from other wavelength channels. In order to directly connect to the deterioration of communication quality, it is desirable to cut off the light output itself from the wavelength variable light source when the SMSR of the wavelength variable light source is below a certain level.

Figure 7:
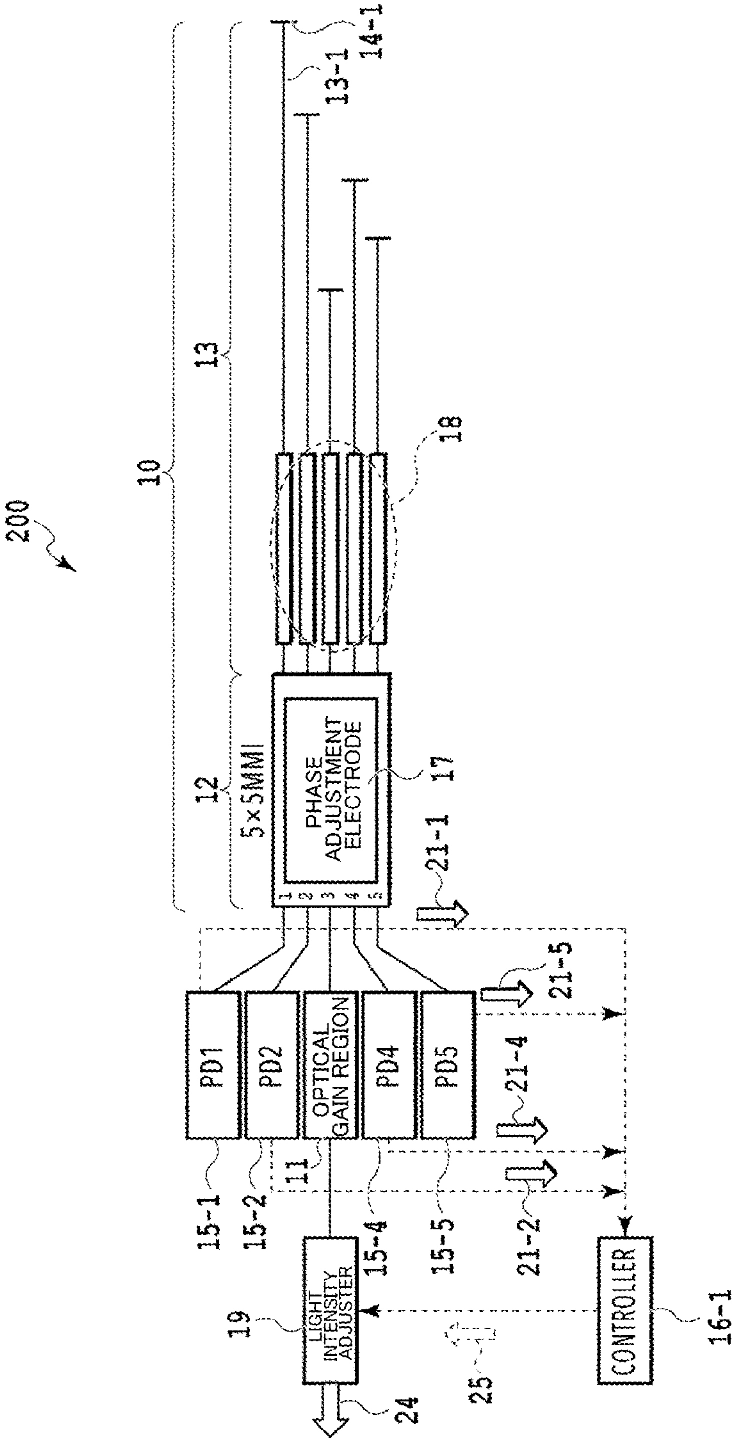
FIG. 7 is a diagram showing a configuration of a wavelength variable light source having a means for blocking oscillation output light.

FIG. 7 is a diagram showing a configuration of a wavelength variable light source having a means for blocking oscillation output light. The wavelength variable light source shown in FIG. 7 is an RTF laser 200, which is common to the RTF laser 100 shown in FIG. 1 in a basic configuration. Therefore, only the difference will be described. An RTF laser 200 of embodiment 3 has the same configuration as RTF laser 100 of FIG. 1, of an RTF 10, an optical gain region 11, a photodetector 15-1 to 15-5, a phase adjustment electrode 17 and a wavelength adjustment electrode 18. The controller 16-1 may be common to the controller 16 of the RTF laser 100 of FIG. 1, or may be a separate dedicated controller.

The RTF laser 200 of this embodiment further includes an optical intensity adjuster (an optical intensity modulator) 19 on the output side of the optical gain region 11. The light intensity signal 21-1 to 21-5 from the non-operating port, which is observed by each photodetector, is given to the controller 16-1. As in the first and second embodiments described above, the light intensity signal 21-1 to 21-5 from the non-operating port reflects the SMSR of the oscillation output light, and can be used to optimize the SMSR. Therefore, when it is confirmed that the SMSR is lowered to a certain degree by using the light intensity signal 21-1 to 21-5 used in the above-described SMSR control method in the RTF laser, the first and second embodiments, the laser output light may be cut off or attenuated by the optical intensity adjuster 19. The influence on other wavelength channels can be minimized by turning off or greatly reducing the intensity of the laser output light. The optical intensity adjuster 19 may be any type as long as the output intensity of the laser output light can be varied. For example, a mechanism for amplifying an optical signal such as a semiconductor optical amplifier may be used, or an optical modulator originally intended to generate an optical signal such as an electroabsorption type optical modulator or a Mach-Zehnder optical modulator may be used.

FIG. 6 is a diagram for explaining optimization at peaks of adjacent fine spectra. FIGS. 6(*a*) and (*b*) shows the state in which the SMSR is optimized by adjusting the reflectance of adjacent fine modes with the coarse filter, further from the state of FIGS. 5(*a*) and (*b*) in which the peak wavelengths of the oscillation fine modes satisfy the longitudinal mode condition.

Figure 8:
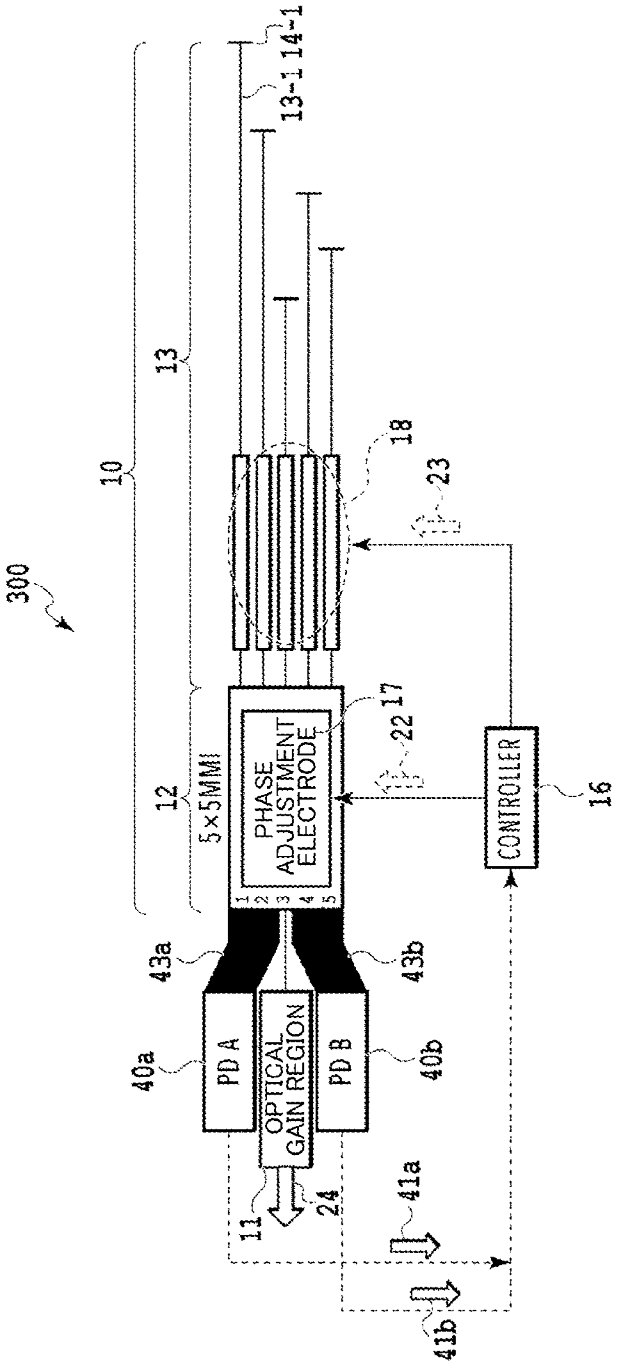
FIG. 8 is a diagram illustrating a configuration of a modification example of a wavelength variable light source of the present disclosure.

FIG. 8 is a view showing a modification of the wavelength variable light source of the present disclosure, which shows a mode of utilizing light from "a portion excluding a port" excluding a waveguide to which an optical gain region is connected. In the RTF laser 300 of the modified example of FIG. 1, the photodetector is composed of a PD A 40*a* and a PD B 40*b*, and only light intensity signals 41*a* and 41*b* from the two photodetectors are supplied to the controller 16. In the two photodetectors, the intensity of light including the port 1, the port 2 and the leaked light is monitored by a photodetector PD A 40*a*, and the intensity of light including the port 4, the port 5 and the leaked light is monitored by a photodetector PD B 40*b*. That is, in the RTF laser of the modification, the SMSR is controlled based on the intensity of the leakage light of the oscillation light from the portion except the port on the M port side. The RTF laser 300 of this embodiment can also adapt the control of SMSR and the basic mechanism of the first embodiment 1 to 3 in the RTF laser.

As described above in detail, in the wavelength variable light source and its control method of the present disclosure, the light intensity of the wavelength of the oscillation light in the plurality of non-operating ports of the MMI is utilized in consideration of the filter characteristics between the operating ports and the non-operating ports which do not directly contribute to the oscillation operation. By controlling the RTF laser so that the monitored light intensity at the non-operation port has a desired relationship, control of the wavelength variable light source reflecting SMSR characteristics is realized. The SMSR can be effectively controlled only by adding a photodetector to a non-operation port which has not been considered by the RTF laser of the prior art. The inspection of SMSR and the monitoring during actual operation in the wavelength variable light source can be realized by a simple mechanism.

The invention claimed is:

1. A method for controlling an oscillation light in a wavelength variable light source comprising: a multi-mode interference waveguide (MMI waveguide) having an M×N port configuration (M is one or more integers, N is two or more integers); N reflection type delay lines connected to the N port side of the MMI waveguide respectively; and an optical gain waveguide connected to at least one port on the M port side of the MMI waveguide; the method comprising:

detecting an intensity of light from two or more ports the M port side of the MMI waveguide, excluding the at least one port, at the oscillation wavelength of the oscillation light, the two or more ports not outputting the oscillation light generated by the optical gain waveguide; and generating a signal for controlling side mode suppression ratio (SMSR) of the oscillation light based on a magnitude relationship between intensities of the light from the two or more ports, wherein the signal is further determined based on a sum of intensities of each light from the two or more ports.

2. The method according to claim 1, further comprising minimizing the intensity from the two or more ports, respectively.

3. The method according to claim 1, wherein the signal comprises a control signal to an optical intensity modulator that varies the output level of the wavelength variable light source.

4. The method according to claim 1, herein the signal maximizes the SMSR of the wavelength variable light source at the oscillation wavelength.

* * * * *